United States Patent
Chua et al.

(10) Patent No.: US 10,939,094 B2
(45) Date of Patent: *Mar. 2, 2021

(54) IMAGE SENSORS FOR ADVANCED DRIVER ASSISTANCE SYSTEMS UTILIZING SAFETY PIXELS TO DETECT MALFUNCTIONS

(71) Applicants: STMicroelectronics (Grenoble 2) SAS, Grenoble (FR); STMicroelectronics Asia Pacific Pte Ltd, Singapore (SG)

(72) Inventors: Lookah Chua, Singapore (SG); Jansen Reyes Duey, Singapore (SG); Tarek Lule, Saint-Egreve (FR); Mathieu Thivin, Voreppe (FR)

(73) Assignees: STMicroelectronics (Grenoble 2) SAS, Grenoble (FR); STMicroelectronics Asia Pacific Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/809,926

(22) Filed: Mar. 5, 2020

(65) Prior Publication Data

US 2020/0204794 A1    Jun. 25, 2020

Related U.S. Application Data

(63) Continuation of application No. 16/502,483, filed on Jul. 3, 2019, now Pat. No. 10,623,728.

(Continued)

(51) Int. Cl.
*H04N 17/00* (2006.01)
*H04N 5/369* (2011.01)
(Continued)

(52) U.S. Cl.
CPC ......... *H04N 17/002* (2013.01); *H04N 5/3696* (2013.01); *H04N 5/37452* (2013.01);
(Continued)

(58) Field of Classification Search
None
See application file for complete search history.

(56) References Cited

U.S. PATENT DOCUMENTS 6,100,833 A    8/2000 Park
6,333,750 B1   12/2001 Odryna et al.
(Continued)

FOREIGN PATENT DOCUMENTS

| CN | 101512905 A | 8/2009 |
| CN | 102624392 A | 8/2012 |
| CN | 102624392 A | 9/2012 |

OTHER PUBLICATIONS

EPO Search Report and Written Opinion for EP 19184337A dated Dec. 2, 2019 (10 pages).
(Continued)

*Primary Examiner* — Jefferey F Harold
*Assistant Examiner* — Mustafizur Rahman
(74) *Attorney, Agent, or Firm* — Crowe & Dunlevy

(57) ABSTRACT

An electronic device includes a voltage divider producing different reference voltages. Dummy pixels each are formed by a transfer gate transistor having a first conduction terminal coupled to a floating diffusion node, a second conduction terminal, and a control node coupled to a first gate signal line, a transmission gate coupled between one of the plurality of taps and the second conduction terminal of the transfer gate transistor, a floating diffusion capacitor coupled between the floating diffusion node and ground, a transistor having a first conduction terminal coupled to the floating diffusion node, a second conduction terminal, and a control terminal coupled to a second gate signal line, and a reset transistor having a first conduction terminal coupled to the upper reference voltage, a second conduction terminal (Continued)

coupled to the second conduction terminal of the transistor, and a control terminal coupled to a reset signal line.

19 Claims, 10 Drawing Sheets

Related U.S. Application Data

(60) Provisional application No. 62/694,526, filed on Jul. 6, 2018.

(51) Int. Cl.
*H04N 5/3745* (2011.01)
*B60W 30/09* (2012.01)
*G08G 1/16* (2006.01)

(52) U.S. Cl.
CPC ......... *B60W 30/09* (2013.01); *B60W 2420/42* (2013.01); *G08G 1/167* (2013.01)

(56) References Cited

U.S. PATENT DOCUMENTS

| | | | | |
|---|---|---|---|---|
| 6,400,220 B1* | 6/2002 | Wang | ............... | H03F 3/45762 330/258 |
| 6,597,395 B1 | 7/2003 | Kim et al. | | |
| 6,797,933 B1 | 9/2004 | Mendis et al. | | |
| 8,953,047 B2* | 2/2015 | Martinussen | ............ | H04N 5/367 348/175 |
| 9,419,052 B2 | 8/2016 | Amikawa et al. | | |
| 10,498,996 B2 | 12/2019 | Nakamura | | |
| 2003/0214596 A1 | 11/2003 | Simony | | |
| 2004/0036453 A1 | 2/2004 | Rossi | | |
| 2006/0007329 A1* | 1/2006 | Panicacci | ............... | H04N 5/378 348/241 |
| 2011/0248371 A1 | 10/2011 | Matsumura et al. | | |
| 2012/0169909 A1 | 7/2012 | Rysinski et al. | | |
| 2012/0274808 A1 | 11/2012 | Chong et al. | | |
| 2013/0321672 A1* | 12/2013 | Silverstein | ............ | G06T 5/005 348/241 |
| 2013/0321673 A1* | 12/2013 | Lim | ............... | G06T 1/20 348/241 |
| 2013/0321674 A1* | 12/2013 | Cote | ............... | G06T 5/006 348/242 |
| 2013/0321675 A1* | 12/2013 | Cote | ............... | H04N 9/64 348/242 |
| 2013/0321676 A1* | 12/2013 | Silverstein | ............ | H04N 5/142 348/242 |
| 2013/0321677 A1* | 12/2013 | Cote | ............... | H04N 5/217 348/243 |
| 2013/0321678 A1* | 12/2013 | Cote | ............... | H04N 5/23229 348/251 |
| 2013/0321700 A1* | 12/2013 | Cote | ............... | G06T 7/90 348/453 |
| 2014/0098272 A1 | 4/2014 | Nakamura et al. | | |
| 2014/0327775 A1* | 11/2014 | Cho | ............... | H04N 5/23216 348/148 |
| 2015/0285625 A1* | 10/2015 | Deane | ............... | G01S 17/48 348/140 |
| 2016/0100116 A1 | 4/2016 | Mesgarini | | |
| 2016/0295205 A1* | 10/2016 | Lim | ............... | H04N 17/002 |
| 2017/0272740 A1* | 9/2017 | Clark, II | ............ | H04N 5/357 |
| 2018/0292206 A1 | 10/2018 | Ohki | | |
| 2019/0149755 A1* | 5/2019 | Yasuma | ............ | H04N 5/232 348/245 |
| 2019/0149758 A1* | 5/2019 | Nakamura | ............ | H04N 5/374 348/187 |
| 2019/0222783 A1* | 7/2019 | Nishihara | ............ | H04N 5/37452 |
| 2019/0373190 A1* | 12/2019 | Kawazu | ............ | H04N 5/37213 |

OTHER PUBLICATIONS

Fei Richun et al: "Bist of Interconnection Lines in the Pixel Matrix of CMOS Imagers," 5th IEEE International Workshop on Advances in Sensors and Interfaces Iwasi IEEE Jun. 13, 2013, pp. 174-177.

On Semiconductor: "Evaluating Functional Safety in Automotive Image Sensors Evaluating Functional Safety in Automotive Image Sensors," May 1, 2018, Retrieved on Nov. 19, 2019 From the Internet.

Tarek Lule et al: "High Performance 1.3MPix HDR Automotive Image Sensor," Jun. 11, 2015, Retrieved From the Internet on Nov. 19, 2019, p. 2, Line 38-39, Fig 1, 2.

EPO Search Report and Written Opinion for EP 20183614.5 dated Sep. 21, 2020 (9 pages).

* cited by examiner

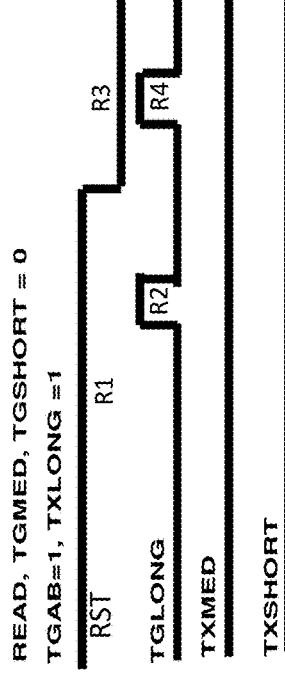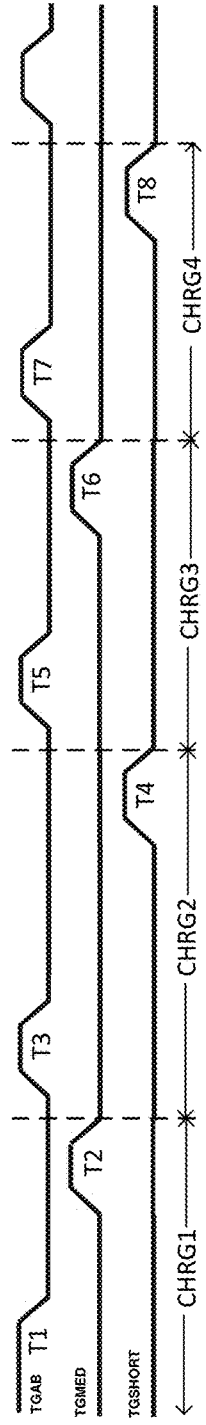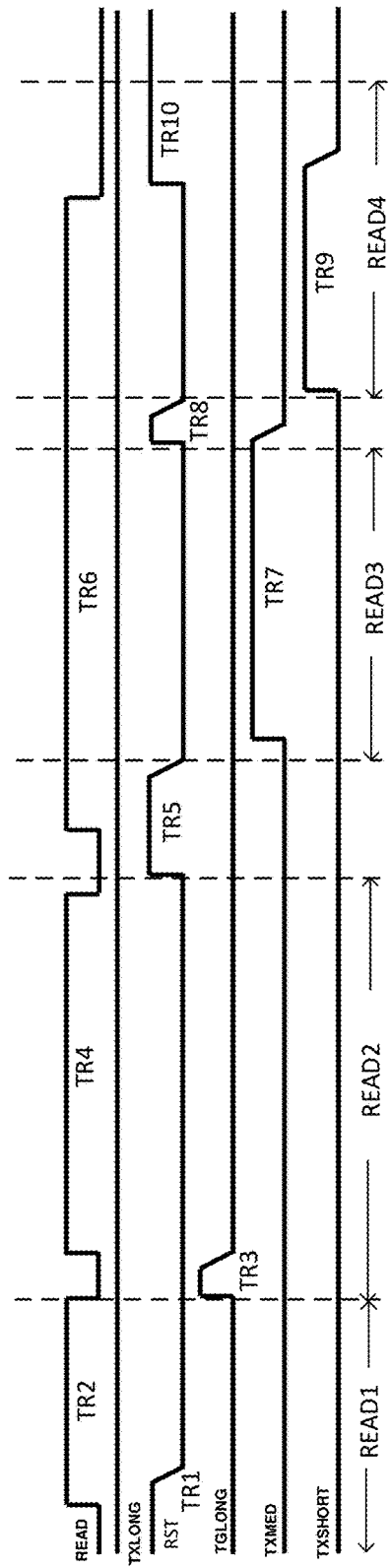
FIG. 4
FIG. 5
FIG. 6

IMAGE SENSORS FOR ADVANCED DRIVER ASSISTANCE SYSTEMS UTILIZING SAFETY PIXELS TO DETECT MALFUNCTIONS

CROSS REFERENCE TO RELATED APPLICATION

This is a continuation of U.S. application for patent Ser. No. 16/502,483, filed Jul. 3, 2019, which claims priority to the United States Provisional application for Patent No. 62/694,526, filed Jul. 6, 2018, the contents of which are incorporated by reference.

TECHNICAL FIELD

This disclosure is related to the field of image sensors for advanced driver assistance systems, and more particularly, to circuits and techniques for the use of dummy or "safety" pixels in such an image sensor to detect improper function of the image sensor.

BACKGROUND

Modern vehicles increasingly are equipped with advanced driver assistance systems (ADAS).

ADAS enable vehicle features such as automated lighting, adaptive cruise control, automatic breaking, collision warnings, proximity warnings, traffic and road condition warnings, connectivity with smartphones, lane keep assist, blind spot monitoring, and automated driving modes. In addition to being used for driver comfort and assistance, these systems may be used for collision avoidance to increase safety. For example, if a driver fails to respond to a proximity warning, automatic braking may allow the vehicle to stop on its own, avoiding a potential collision. Automated driving may function so as to steer the vehicle around dangers, or to steer the vehicle back into its lane if the driver begins to drift out of the lane.

Advanced driver assistance systems (ADAS) rely on inputs from multiple data sources, including automotive imaging, light detection and ranging, radar, image processing, computer vision, and in-car networking. Additional inputs are possible from other sources separate from the primary vehicle platform, such as other vehicles (referred to as vehicle-to-vehicle systems) or from infrastructure such as cellular data or wireless internet systems (referred to as vehicle-to-infrastructure systems).

A primary sensor for many ADAS systems is an image sensor. As ADAS systems have progressed from driver assistance to include the automation and safety functions discussed above, the safe operation of the vehicle will depend more and more on the reliability of the image sensor and imaging system. Therefore, the reliable operation of the image sensor has become a critical safety component in many modern vehicles.

As a consequence, the ISO 26262 standard was developed to include the Automotive Safety Integrity Level (ASIL) risk classification scheme. The ASIL levels range from the lowest, ASIL-A (lowest), to ASIL-D (highest). An ASIL level is determined by three factors, namely the severity of a failure, the probability of a failure occurring, and the ability for the effect of the failure to be controlled.

Faults in semiconductor devices, such as image sensors, may arise from a number of causes including cosmic radiation, electromigration, early mortality, and a host of other reasons. Due to the importance of the operation of an image sensor in an ADAS system, is therefore desired to detect faults in the operation of an image sensor in an ADAS system as quickly as possible and as accurately as possible.

SUMMARY

Disclosed herein is an electronic device including: an array of image pixels having inputs coupled to control lines and outputs coupled to output lines; an array of dummy pixels having inputs coupled to the control lines; wherein each dummy pixel of the array of dummy pixels is configured to provide a certain output signal in an absence of a fault with at least one of the control lines or in an absence of a fault with at least one of the output lines; and control circuitry coupled to the output lines to receive output signals from the array of image pixels and the certain output signals from the array of dummy pixels, the control circuitry configured to determine whether the certain output signal was output by one or more dummy pixels of the array of dummy pixels.

Also disclosed herein is an electronic device including: an array of image pixels having inputs coupled to control lines and outputs coupled to output lines; and at least one array of dummy pixels having inputs coupled to the control lines; wherein each dummy pixel of the at least one array of dummy pixels is configured to provide a certain output signal in an absence of a fault with at least one of the control lines or in an absence of a fault with at least one of the output lines; and wherein the at least one array of dummy pixels comprises first and second column arrays of dummy pixels arranged about first and second opposing sides of a periphery of the array of image pixels.

Additionally disclosed herein is an electronic device including: a voltage divider coupled between upper and lower reference voltages and having a plurality of taps therebetween, each tap producing a different reference voltage; and a plurality of dummy pixels. Each dummy pixel includes: a transfer gate transistor having a first conduction terminal coupled to a floating diffusion node, a second conduction terminal, and a control node coupled to a first gate signal line; a transmission gate coupled between one of the plurality of taps and the second conduction terminal of the transfer gate transistor; a floating diffusion capacitor coupled between the floating diffusion node and ground; a transistor having a first conduction terminal coupled to the floating diffusion node, a second conduction terminal, and a control terminal coupled to a second gate signal line; and a reset transistor having a first conduction terminal coupled to the upper reference voltage, a second conduction terminal coupled to the second conduction terminal of the transistor, and a control terminal coupled to a reset signal line. Readout circuitry is coupled between the floating diffusion node and a read signal line.

Also disclosed herein is a method of detecting a fault with an array of image pixels including comparing an output of each dummy pixel of an array of dummy pixels to a corresponding certain output signal, wherein a failure of a dummy pixel to produce output equal to its corresponding certain output signal indicates a potential fault with the array of image pixels.

BRIEF DESCRIPTION OF THE DRAWINGS

FIG. 4 is a timing diagram showing operation of the ASIL pixels of FIG. 1 during a reset phase.

FIG. 5 is a timing diagram showing operation of the ASIL pixels of FIG. 1 during a memory capacitor charge operation.

FIG. 6 is a timing diagram showing operation of the ASIL pixels of FIG. 1 during a readout operation.

DETAILED DESCRIPTION

Figure 1:
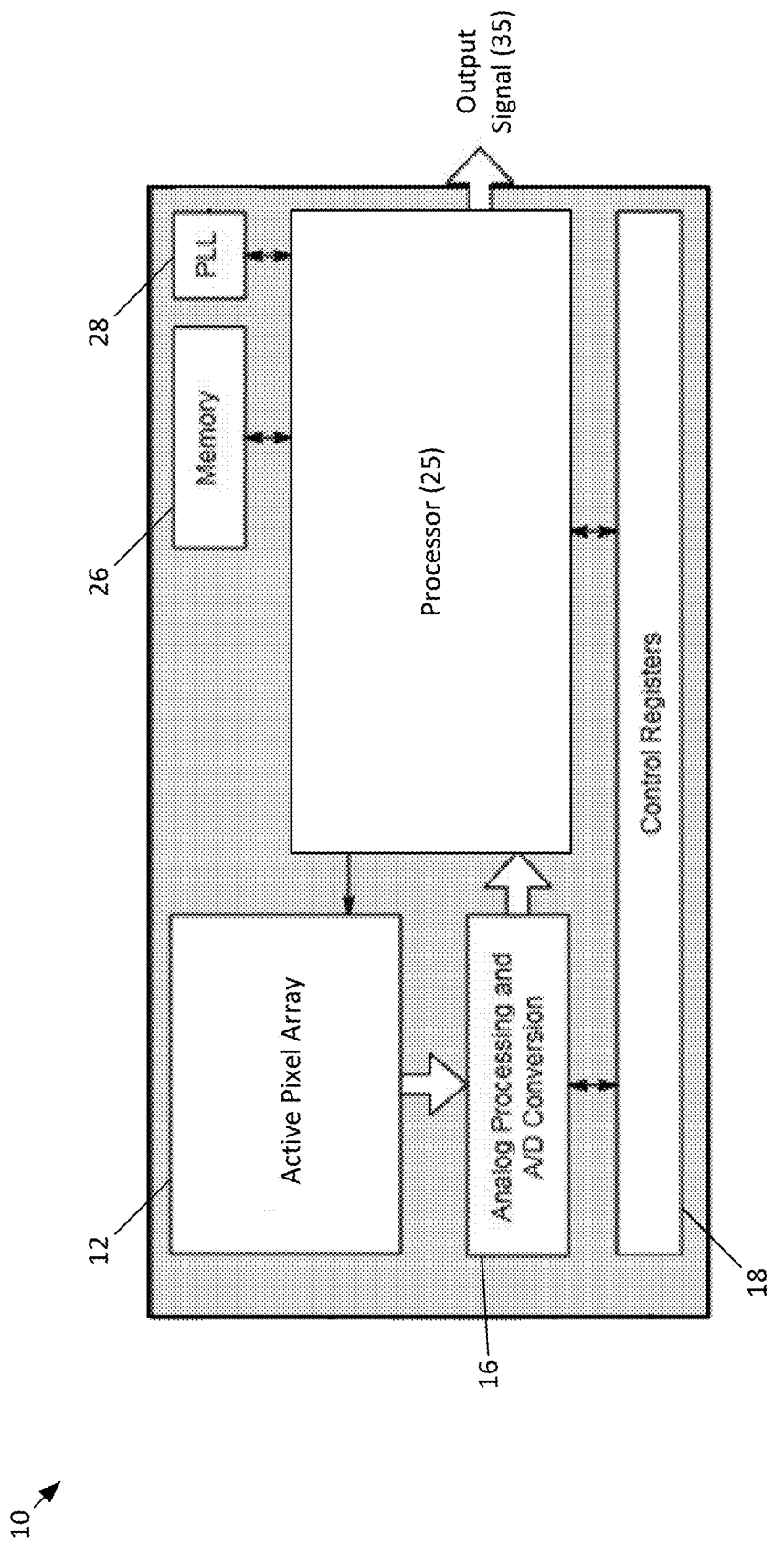
FIG. 1 is a block diagram of an advanced driver assistance system (ADAS) in accordance with this disclosure.

The following disclosure enables a person skilled in the art to make and use the subject matter disclosed herein. The general principles described herein may be applied to embodiments and applications other than those detailed above without departing from the spirit and scope of this disclosure. Prime notation is used to show similar structures that operate differently in different embodiments. Reference numerals in parentheses are used in the drawing figures to denote signals. This disclosure is not intended to be limited to the embodiments shown, but is to be accorded the widest scope consistent with the principles and features disclosed or suggested herein.

An advanced driver assistance system (ADAS) 10 is now described with reference to FIG. 1. The advanced driver assistance system 10 can be incorporated into an automobile, such as a car or light duty truck, or can be incorporated into commercial vehicles, such as class-8 vehicles (sometimes referred to as a "semi" or "18 wheeler"). The advanced driver assistance system 10 includes an active pixel array 12 that captures image data in an analog format and provides the image data, in an analog fashion, to the analog processing and analog to digital conversion block 16, which filters the image data in the analog domain and converts the image data to the digital domain to produce digital image data. The analog processing and analog to digital conversion block 16 passes the digital image data to a processor 25, which, pursuant to settings received from the control registers 18, performs desired digital processing functions, such as determining that the vehicle into which the advanced driver assistance system 10 is incorporated is headed toward an imminent collision. All such digital processing functions are within the scope of this disclosure. The processor 25 provides its output signal 35 via a suitable data interface, such as a parallel data interface or a serial data interface, either directly to other components of the vehicle into which the advanced driver assistance system 10 is associated, or to such components via a data bus.

A phase locked loop 28 provides a clock signal for use by the processor 20, and a memory 26 provides non-volatile or volatile data storage for the processor 20.

Figure 2:
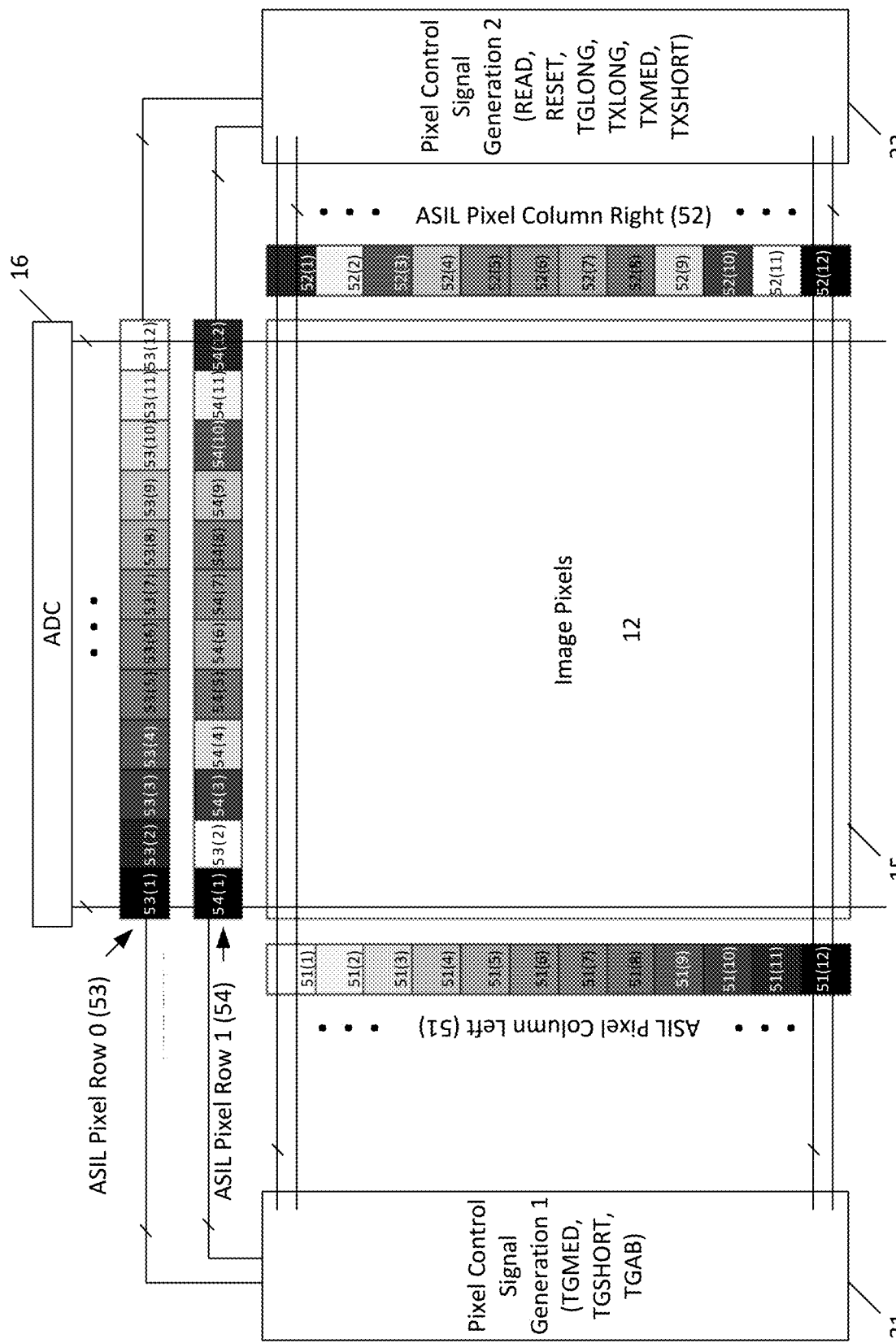
FIG. 2 is a diagram of the active pixel array of the ADAS of FIG. 1.

Further details of the active pixel array 12 are now given with reference to FIG. 2. The active pixel array 12, as shown in FIG. 2, includes an array of image pixels 15 that perform the image capture. Bordering the array of image pixels 15 on opposite sides is a pair of analog automotive safety integrity level (ASIL) pixel columns 51 and 52, and bordering the array of image pixels 15 on one side is a pair of analog ASIL pixel rows 53 and 54.

In some cases, the pixels of the ASIL pixel columns 51-52 and the ASIL pixel rows 53-54 have the same, or substantially the same, electrical structure as the pixels of the array of image pixels 15, and share the same control signal lines and output lines, with one difference. This difference is that instead of a photodiode or photodiodes providing an input voltage to be used to charge up storage capacitors, or through which fully charged up (reset) storage capacitors can discharge, a voltage divider (or voltage dividers) is provided that can be used to charge up storage capacitors, or through which fully charged up (reset) storage capacitors can discharge. Since the voltages at the taps of the voltage divider are known, performing a given operation on the ASIL pixels should produce a known result. When the known result is not produced, it can be inferred that one or more of the control signal lines has failed or that the readout circuitry such as the ADC 16 or addressing circuitry has failed. Thus, it can be inferred that the output of the pixels of the array of image pixels 15 cannot be trusted, since the array of image pixels 15 shares the exact same control signal lines as the ASIL pixels and uses the same ADC 16 and addressing circuitry. Thus, the advanced driver assistance system 10 can take appropriate action based upon this knowledge (e.g., de-activating an auto-drive mode, warning a driver that collision detection or lane departure warnings are offline, etc.).

In other cases, however, the pixels of the ASIL pixel columns 51-52 and the ASIL pixel rows 53-54 may take different forms and be electrically different from the pixels of the array of image pixels 15, provided that the ASIL pixel columns 51-52 and ASIL pixel rows 53-54 have known outputs, and share the same control and output lines as the pixels of the array of image pixels 15.

ASIL pixel column 51 contains ASIL pixels 51(1)-51(12), while ASIL pixel column 52 contains ASIL pixels 52(1)-52(12). Similarly, ASIL pixel row 53 contains ASIL pixels 53(1)-53(12) while ASIL pixel row 54 contains ASIL pixels 54(1)-54(12). It will be understood that the reference to twelve for the number of pixels is by example only and that in practice the array may include any desired number of pixels.

ASIL pixel column 51 is depicted as a reference greyscale ramp from bottom to top (to indicate its expected outputs) while ASIL pixel column 52 is depicted as two crossing reference greyscale ramps from bottom to top (to indicate its expected outputs). ASIL pixel row 53 is depicted as a reference greyscale ramp from left to right (to indicate its expected outputs), while ASIL pixel row 54 depicted as two crossing reference greyscale ramps from left to right (to indicate its expected outputs). The purpose of these different ramps is to allow distinguishing of which row or column of the array of active pixels 12 has failed.

Pixel control block 31 generates the control signals TGMED, TGSHORT, and TGAB, and passes these signals to each pixel of the ASIL pixel column 51, image pixels 15, and ASIL pixel column 52. In doing so, it is noted that the same signal lines from pixel control block 33 are shared by the ASIL pixel column 51, array of image pixels 15, and ASIL pixel column 52, such that a defect in a given signal line running to a given pixel of the array of image pixels 15 will affect not only that pixel, but also at least one corresponding pixel of the ASIL pixel column 51 or ASIL pixel column 52.

Similarly, pixel control block 33 generates the readout signals READ, RESET, TGLONG, TXLONG, TXMED, and TXSHORT, and passes these signals to each pixel of the ASIL pixel column 51, array of image pixels 15, and ASIL pixel column 52. In doing so, it is noted that the same readout lines from pixel control block 33 are shared by the ASIL pixel column 51, image pixels 15, and ASIL pixel column 52, such that a defect in a given signal line running to a given pixel of the array of image pixels 15 (or a defect in circuitry addressing that pixel) will affect not only that pixel, but also at least one corresponding pixel of the ASIL pixel column 51 or ASIL pixel column 52.

The ADC 16 is selectively coupled to each pixel of the array of image pixels 15, ASIL pixel row 53, and ASIL pixel row 54. It is noted that the same signal lines from ADC 16 are shared by the ASIL pixel row 53 and ASIL pixel row 54, such that a defect in a given signal line running to a given pixel of the image pixels 15 will affect not only that pixel, but also at least one corresponding pixel of the ASIL pixel row 53 or ASIL pixel row 54.

The ASIL pixel columns 51-52 act as reference pixels, and are capable of detecting defects in any of the lines carrying (or circuitry generating) the pixel control signals, TGMED, TGSHORT, TGAB, READ, RESET, TGLONG, TXLONG, TXMED, and TXSHORT. Similarly, analog ASIL pixel rows 53-54 act as reference pixels, and are capable of detecting defects in any of the lines conveying data to the ADC 16, addressing the active pixel array 12, or ultimately the memory 26.

Figure 3:
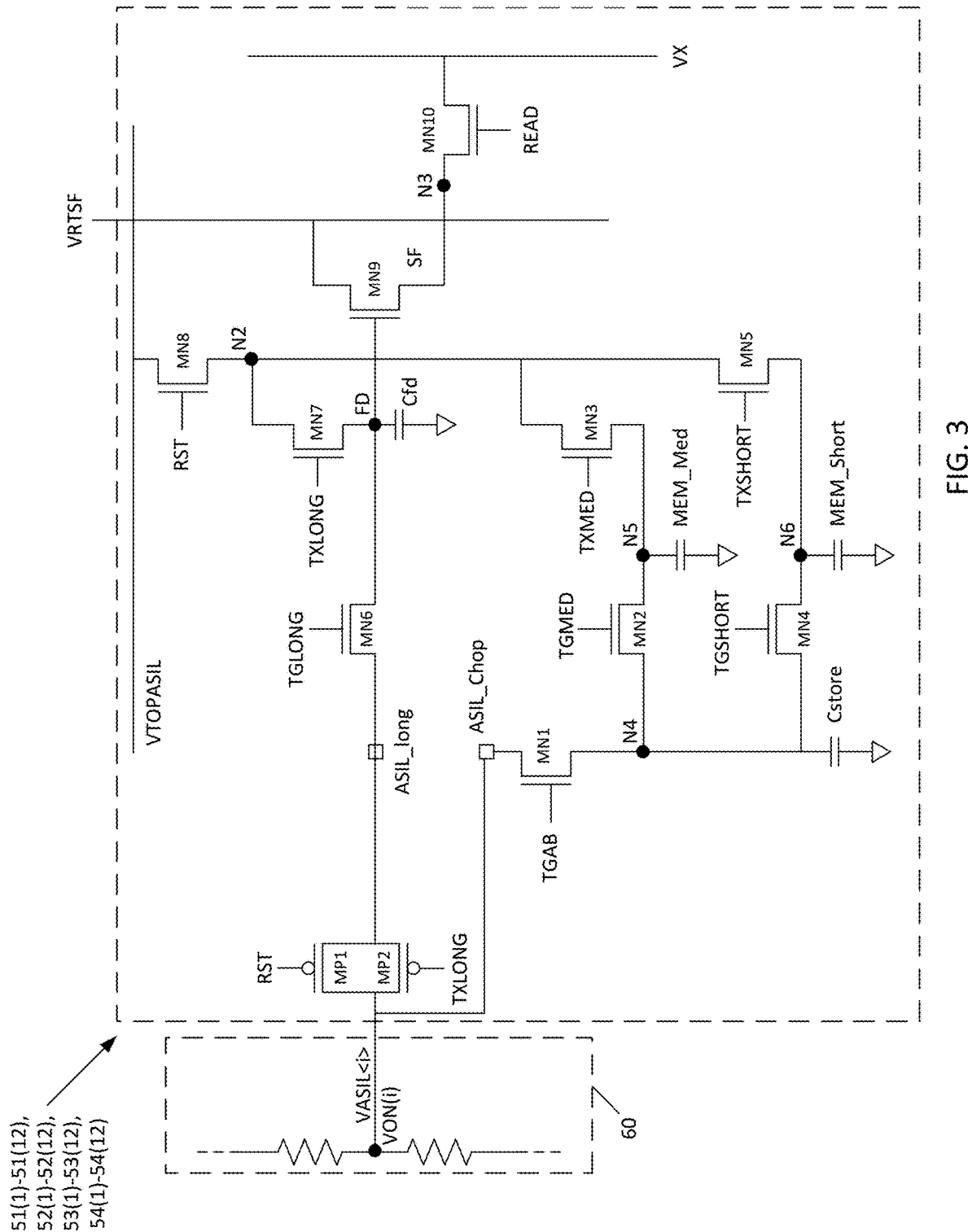
FIG. 3 is a schematic diagram showing the structure of one of the automotive safety integity (ASIL) pixels of the array of pixels of FIG. 2. Each such ASIL pixel has this structure.

Each pixel of the ASIL pixel columns 51-52 and ASIL pixel rows 53-54 has a same structure, which is depicted schematically in FIG. 3. It should be understood that the following structure is applicable to each pixel 51(1)-51(12), 52(1)-52(12), 53(1)-53(12), 54(1)-54(12).

A transmission gate is formed from PMOS transistors MP1, MP2, and is coupled between node VON[i] and node ASIL_long, with i being an index corresponding to which output node on a voltage divider 60 is represented. The specific order of these pairings will be described in detail below.

The PMOS transistor MP1 has its drain coupled to node VON[i], its source coupled to the node ASIL_long, and its gate biased by the reset signal RST. In addition, the PMOS transistor MP2 has its drain also coupled to node VON[i], its source also coupled to nod ASIL_long, and its gate biased by the TXLONG signal.

An NMOS transistor MN6 has its source coupled to the node ASIL_long, its drain coupled to floating diffusion node FD, and its gate biased by signal TGLONG. A floating diffusion capacitor Cfd is coupled between the floating diffusion node FD and ground. An NMOS transistor MN7 has its source coupled to the floating diffusion node FD, its drain coupled to node N2, and its gate biased by signal TXLONG. The NMOS transistor MN8 has its drain coupled to the VTOPASIL line, its source coupled to node N2, and its gate biased by the reset signal RST.

An NMOS transistor MN9 has its drain coupled to the VRTSF line, its source coupled to node N3, and its gate biased by the floating diffusion node FD (meaning that NMOS transistor MN9 is configured as a source follower). An NMOS transistor MN10 has its drain coupled to node N3, its source coupled to the output line VX, and its gate biased by the read signal READ.

An NMOS transistor MN1 has its source coupled to the node ASIL_Chop, its drain coupled to node N4, and its gate biased by the TGAB signal. Storage capacitor Cstore is coupled between node N4 and ground.

An NMOS transistor MN2 has its source coupled to node N4, its drain coupled to node N5, and its gate biased by the TGMED signal. Memory capacitor MEM_Med is coupled between node N5 and ground. An NMOS transistor MN3 has its source coupled to node N5, its drain coupled to node N2, and its gate biased by the TXMED signal.

An NMOS transistor MN4 has its source coupled to node N4, its drain coupled to node N6, and its gate biased by the TGSHORT signal. Memory capacitor MEM_Short is coupled between node N6 and ground. An NMOS transistor MN5 has its drain coupled to node N2, its source coupled to node N6, and its gate biased by the TXSHORT signal.

Operation of the ASIL pixels of FIG. 3 will now be further described with reference to the timing diagrams of FIGS. 4-6.

In a reset phase, shown in FIG. 4, the read signal READ, TGMED signal, and TGSHORT signals are deasserted, while the TGAB and TXLONG signals are asserted. In the reset phase, since TGAB is asserted, the storage capacitor Cstore is charged to VASIL<i>. In addition, assertion of the rest signal RST and assertion of the TXLONG signal during time period R1 serves to turn on NMOS transistors MN8 and MN7, charging the floating diffusion capacitor Cfd to VTOPASIL. During time period R2, which occurs during the time period R1, the TGLONG signal is asserted, which in the ASIL pixels has no effect. During time period R3, the reset signal RST is deasserted, and during time period R4 (within time period R3) TGLONG is asserted, which in the ASIL pixels also has no effect.

During time period R5, the reset signal RST is asserted. When the TXSHORT signal is asserted during the time period R6 (which occurs during time period R6), NMOS transistor MN5 is turned on, and since the reset signal RST is asserted, this results in charging of the storage capacitor MEM_Short to VTOPASIL.

In addition, during time period R5, the reset signal RST is asserted. When the TXMED signal is asserted during the time period R7 (which occurs during time period R5), NMOS transistor MN3 is turned on, and since the reset signal RST is asserted, this results in charging of the storage capacitor MEM_Med to VTOPASIL.

This ends the reset phase.

Referring now FIG. 5, in a first phase, MEM_Med and Mem_Short are discharged to or near to VASIL<i> in a series of charge transfers. In greater detail, during a first charge transfer period CHRG1, the TGAB signal is asserted during time period T1, turning on NMOS transistor MN1 and thus helping to charge the storage capacitor Cstore to VASIL<i>. Thereafter, the TGMED signal is asserted during time period T2, turning on NMOS transistor MN2 and sharing charge between the memory capacitor Cstore and memory capacitor MEM_Med. Since memory capacitor MEM_Med will have been charged to VTOPASIL during the reset phase, and since memory capacitor Cstore will have been charged to VASIL<i>, charge transfer serves to transfer charge from memory capacitor MEM_Med into Cstore, and ultimately discharge some charge through the voltage divider 60 through node VON[i].

During a second charge transfer period CHRG2, the TGAB signal is asserted during time period T3, turning on NMOS transistor MN1 to help charge storage capacitor Cstore again to VASIL<i>. Thereafter, the TGSHORT signal is asserted during time period T4, turning on NMOS transistor MN4, resulting in sharing of charge between the memory capacitor Cstore and memory capacitor MEM_Short. Since memory capacitor MEM_Short will have been charged to VTOPASIL during the reset phase, and since memory capacitor Cstore will have been charged to VASIL<i>, charge transfer serves to transfer charge from memory capacitor MEM_Short into Cstore, and ultimately discharge some charge through the voltage divider 60 through node VON[i].

During a third charge transfer period CHRG3, the TGAB signal is asserted during time period T5, turning on NMOS transistor MN1 to charge storage capacitor Cstore again to VASIL<i>. Thereafter, the TGMED signal is asserted during time period T6, turning on NMOS transistor MN2, and once again causing sharing of charge between the memory capacitor Cstore and memory capacitor MEM_Med as described above.

During a fourth charge transfer period CHRG4, the TGAB signal is asserted during time period T7, turning on NMOS transistor MN1 to charge storage capacitor Cstore again to VASIL<i>. Thereafter, the TGSHORT signal is asserted during time period T8, turning on NMOS transistor MN4, resulting in sharing of charge between the memory capacitor Cstore and memory capacitor MEM_Med as described above.

This repetition between time periods during which charge is shared between storage capacitor Cstore and memory capacitor MEM_Med, and during which charge is shared between storage capacitor Cstore and memory capacitor MEM_Short, is performed a sufficient number of times such that the memory capacitors MEM_Med and MEM_Short are discharged to or close to VASIL<i>.

Now referring to FIG. 6, in a second phase, in order, VASIL<i> is read out, MEM_Med is read out, and then MEM_Short is read out. In greater detail, during a first readout period READ1, the reset signal RST is asserted during time period TR1, serving to turn off the transmission gate formed by PMOS transistors MP1 and MP2 since the TXLONG signal remains asserted. This turns on NMOS transistors MN8 and MN7, resulting in the charging of the floating diffusion capacitor Cfd to VTOPASIL. Then, the read signal READ is asserted during time period TR2, resulting in the NMOS transistor MN10 turning on, and the voltage on the floating diffusion capacitor Cfd, which is at or about VTOPASIL, being replicated to the output VX via NMOS transistor MN9 acting as a source follower.

Now, the second readout period READ2 begins. During the time period TR3, the TGLONG signal is asserted, turning on NMOS transistor MN6, serving to discharge the floating diffusion capacitor Cfd through the voltage divider 60, until the voltage on the floating diffusion capacitor Cfd reaches VASIL<i>. Then, during the time period TR4, the read signal READ is asserted again, resulting in readout at the output VX of the voltage on the floating diffusion capacitor Cfd, which is at or about VASIL<i>.

Next, the third readout period READ3 begins. During the time period TR5, the reset signal RST is asserted, resulting in the floating diffusion capacitor Cfd being recharged to VTOPASIL. Then, during the time period TR6, the read signal READ is asserted, initially resulting in the readout at the output VX of the voltage on the floating diffusion capacitor Cfd, which is at or about VTOPASIL. However, time period TR7 begins during time period TR6, and during time period TR6, the TXMED signal is asserted. This results in the NMOS transistor MN3 being turned on, the sharing of charge between the memory capacitor MEM_Med and the floating diffusion capacitor Cfd, and the readout at the output VX of the resulting voltage on the floating diffusion capacitor Cfd.

After this, the fourth readout period READ4 begins. During the time period TR8, the reset signal RST is asserted, turning on the NMOS transistor MN8 to charge the floating diffusion capacitor Cfd to VTOPASIL. Of note is that during time period TR8, time period TR6 has not yet ended, so during time period TR8, VTOPASIL as on the floating diffusion capacitor Cfd is read out at the output VX. Next, during time period TR9, the TXSHORT signal is asserted while time period TR6 continues. This results in sharing of charge between the memory capacitor MEM_Short and the floating diffusion capacitor Cfd, and the readout of the resulting voltage on the floating diffusion capacitor Cfd.

This ends a full cycle of operation of the ASIL pixel. A new cycle begins anew with the reset phase, and then sequentially continued into the first and second phases.

Figure 7:
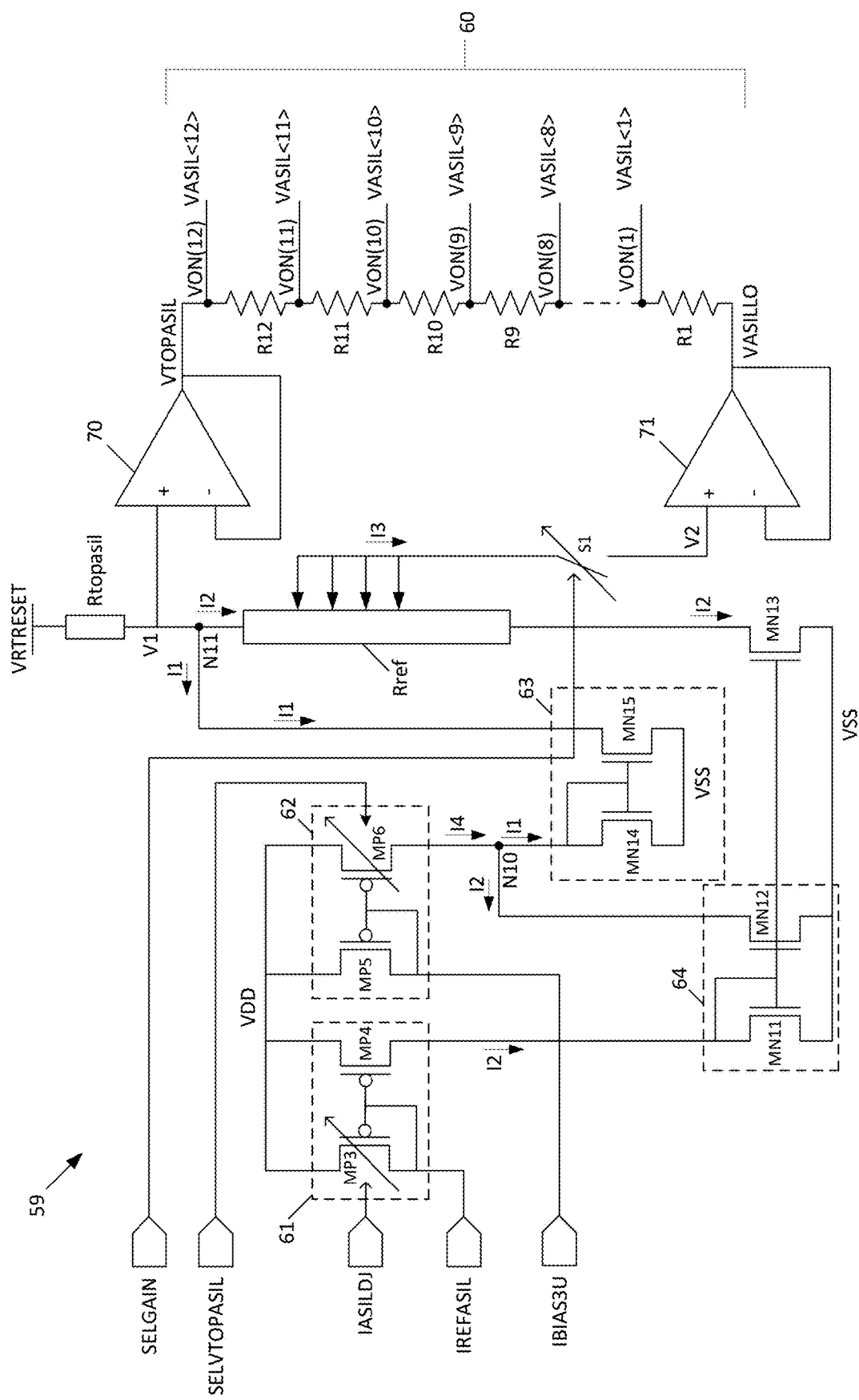
FIG. 7 is a schematic diagram of the voltage divider that supplies different reference voltages to the ASIL pixels of FIG. 3.

The voltage divider 60 and power supply circuitry 59 are now described with reference to FIG. 7. The voltage divider 60 is comprised of twelve resistors R1-R12 coupled in series between reference voltage VASILLO and reference voltage VTOPASIL. The output nodes VON[1]-VON[12] are between the resistors R1-R12. Output voltages VASIL<1>-VASIL<12> are output at output nodes VON[1]-VON[12].

It should be appreciated that there may be any number of such resistors R1-R12 so as to produce any desired number of output voltages VASIL<i>, and that the twelve shown are just for the sake of example. For example, 16 or 32 resistors may be used.

The reference voltage VTOPASIL is produced by unity gain amplifier 70, and the reference voltage VASILLO is produced by unity gain amplifier 71.

Since the amplifier 70 is in unity gain configuration, generation of the VTOPASIL signal is a function of the voltage V1 at the non-inverting terminal of the amplifier 70. This voltage is a function of the current I2 through adjustable resistance Rref.

Current mirror 61 is comprised of a PMOS transistor MP4 in a current mirror relationship with a selectable number of PMOS transistors MP3. PMOS transistors MP4 and MP3 have their sources coupled to the reference voltage VDD. The input to the current mirror 61 is the reference current IREFASIL signal as fed to the drain of PMOS transistor MP3, and the output of the current mirror 61 is current I2, which flows from the drain of PMOS transistor MP4.

The number of PMOS transistors MP3 activated is set by the IASILDJ signal. The output of the current mirror 61 is the current I2, which is therefore set by the IASILDJ signal. Therefore, what is happening here is that the IASILDJ signal is setting the mirroring ratio of the current mirror 61, i.e. determining a in equation I2=α*IREFASIL.

Current mirror 64, comprised of NMOS transistors MN11 and MN12 having their sources coupled to the reference voltage VSS, receives current I2 as input at the drain of NMOS transistor MN11 and generates current I2 as an output from the drain of NMOS transistor MN12 to node N10. So here, the mirroring ratio is 1.

Current mirror 62 is comprised of a PMOS transistor MP5 in a current mirror relationship with a selectable number of PMOS transistors MP6. PMOS transistors MP6 and MP5 have their sources coupled to the reference voltage VSS. The input to the current mirror 62 is the IBIAS3U signal received at the drain of PMOS transistor MP5, and the number of PMOS transistors MP6 activated is set by the SELVTOPA-SIL signal. Thus, the SELVTOPASIL signal is setting the mirroring ratios of the current mirror 62, i.e. determining a in equation I4=α*IBIAS3U. The output of the current mirror 62 is the current I4, supplied from the drain of transistors MP6 to node N10. Node N10 therefore acts as a subtractor, subtracting current I2 from current I4 to produce current I1.

Current mirror 63 is comprised of NMOS transistor MN14 and MN15 in a current mirror relationship, which have their sources coupled to VSS. The drain of NMOS transistor MN14 forms the input of the current mirror 63 and receives the current I1, and the drain of NMOS transistor MN15 forms the output of the current mirror 63, drawing current I1 from node N11. Here, the mirroring ratio is also 1.

Since NMOS transistor MN13 is in a current mirror relationship with the NMOS transistors MN11 and MN12 of current mirror 64, current I2 is drawn through the adjustable resistance Rref. This sets the voltage at node V1, and thus, as explained above, VTOPASI.

SELGAIN is used to adjust the adjustable resistance Rref, thereby adjusting the voltage V1 at node N11 produced by current I2 flowing through Rref. The voltage V1 is passed through the amplifier 70 as the first reference voltage VTOPASIL. Therefore, it can be said that SELVTOPASIL sets the reference voltage VTOPASIL Since the current I2 is a function of the IASILDJ signal, and since the current I2 through the adjustable resistance Rref ultimately sets the voltage V2, which in turn sets VASILLO, it can be said that IASILDJ sets the reference voltage VASILLO.

Figure 8:
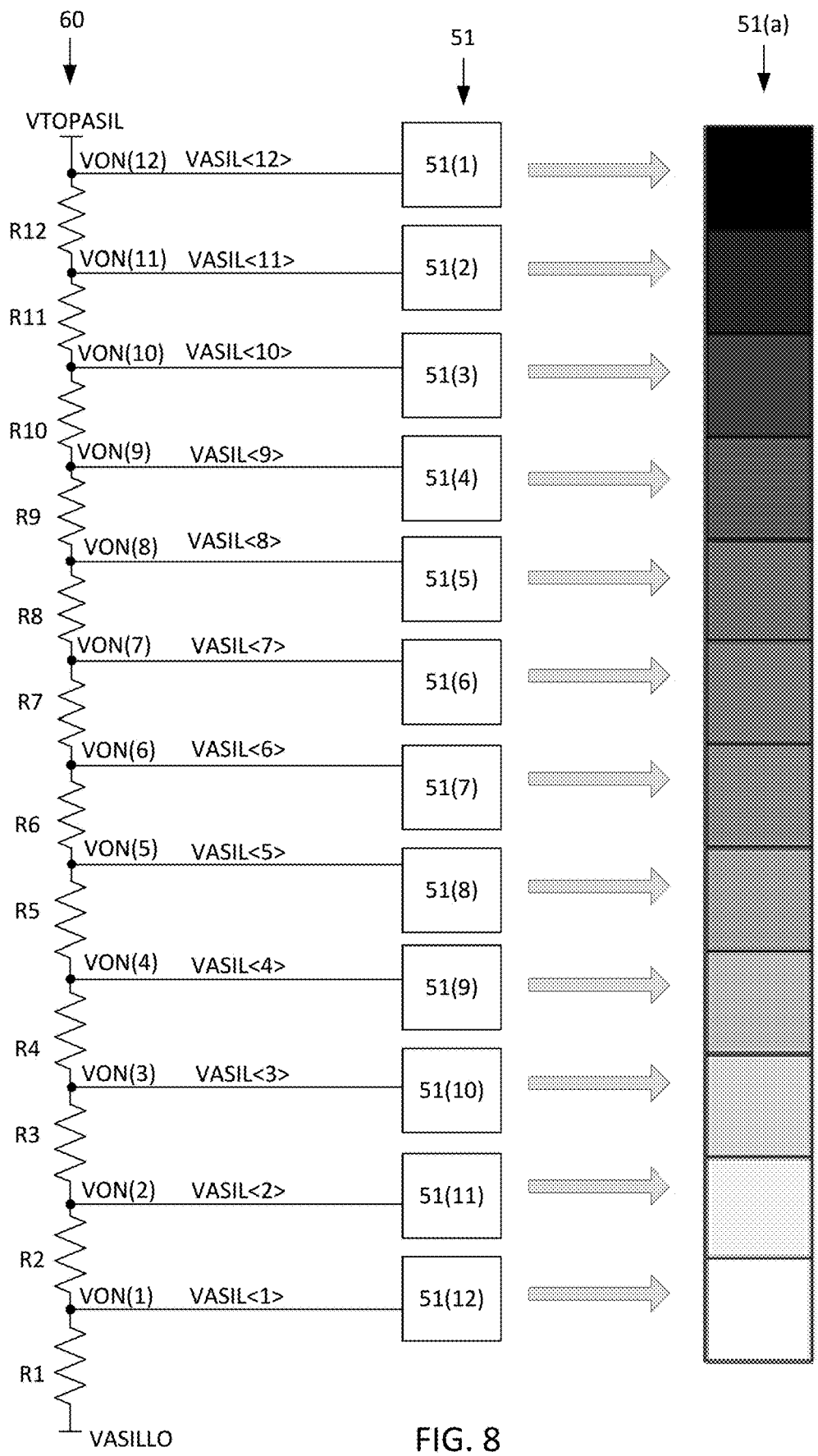
FIG. 8 is a diagram showing the left ASIL pixel column of the active pixel array of FIG. 1, in which the connections between the reference voltages and the individual ASIL pixels of the left ASIL pixel column can be seen, correlated to the associated luminances simulated by those individual ASIL pixels.

ASIL pixel column 51 of FIG. 2 is shown in greater detail in FIG. 8. As can be seen, the pixels 51(1)-51(12) of the ASIL pixel column 51 respectively receive the voltages VASIL<12>-VASIL<1> from output nodes VON(12)-VON(1) of the voltage divider 60. Since VASILLO is the low reference voltage of the voltage divider 60, VASIL<1> is the lowest voltage produced as a reference for the ASIL pixel column 51, and therefore provides a dummy input of white, as shown in reference 51(a). Likewise, since VTOPASIL is the high reference voltage of the voltage divider 60, VASIL<12> is the highest voltage produced as a reference for the ASIL pixel column 51, and therefore provides a dummy input of black, as shown in reference 51(a). Thus, the dummy inputs form the gradient pattern shown in reference 51(a).

Figure 9:
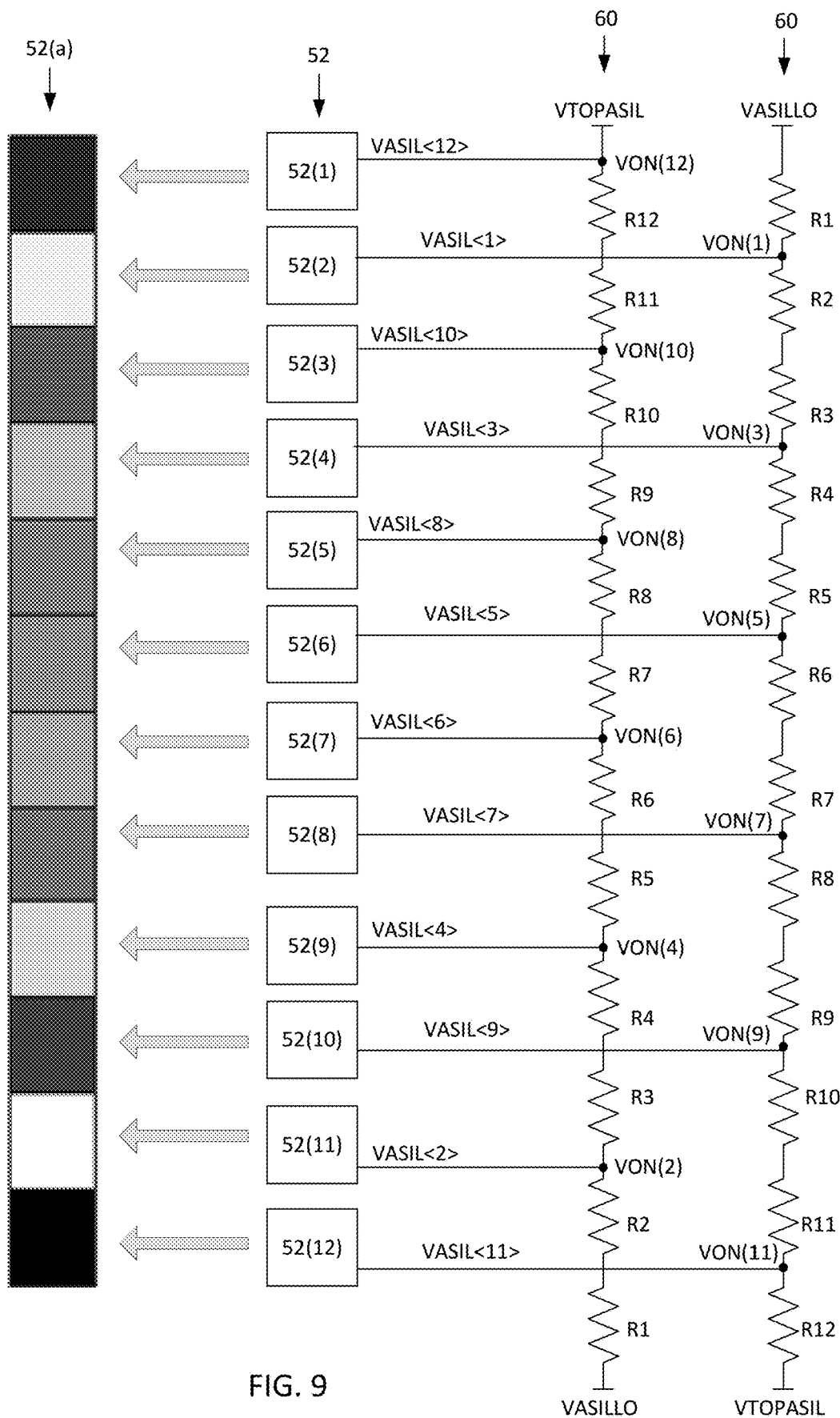
FIG. 9 is a diagram showing the right ASIL pixel column of the active pixel array of FIG. 1, in which the connections between the reference voltages and the individual ASIL pixels of the right ASIL pixel column can be seen, correlated to the associated luminances simulated by those individual ASIL pixels.

ASIL pixel column 52 of FIG. 2 is shown in greater detail in FIG. 9. Here, it can be seen that odd numbers of the ASIL pixels 52, which are 52(1), 52(3), 52(5), 52(7), 52(9), and 52(11), respectively receive the voltages VASIL<12>, VASIL<10>, VASIL<8>, VASIL<6>, VASIL<4>, and VASIL<2> from nodes VON[12], VON[10], VON[8], VON [6], VON[4], and VON[2]. In addition, the even numbers of the ASIL pixels 52, which are 52(2), 52(4), 52(6), 52(8), 52(10) and 52(12) respectively receive the voltages VASIL<1>, VASIL<3>, VASIL<5>, VASIL<7>, VASIL<9>, and VASIL<11> from nodes VON[1], VON[3], VON[5], VON[7], VON[9], and VON[11]. This results in the dummy inputs forming a cross-gradient pattern, as shown in reference 52(a).

In the ASIL pixel column 52 shown in FIG. 9, two instances of voltage divider 60 are shown, one producing the voltages VASIL<12>, VASIL<10>, VASIL<8>, VASIL<6>, VASIL<4>, and VASIL<2> from nodes VON[12], VON [10], VON[8], VON[6], VON[4], and VON[2], and the other producing the voltages VASIL<1>, VASIL<3>, VASIL<5>, VASIL<7>, VASIL<9>, and VASIL<11> from nodes VON [1], VON[3], VON[5], VON[7], VON[9], and VON[11]. The difference between these two shown multiple voltage dividers 60 is the reversal of the reference voltages VTOPA-SIL and VASILLO. While multiple voltage dividers 60 can be used as shown, in some instances, but a single voltage divider 60 can be used and can produce the voltages VASIL<1>-VASIL<12> from nodes VON[1]-VON[12].

Figure 10:
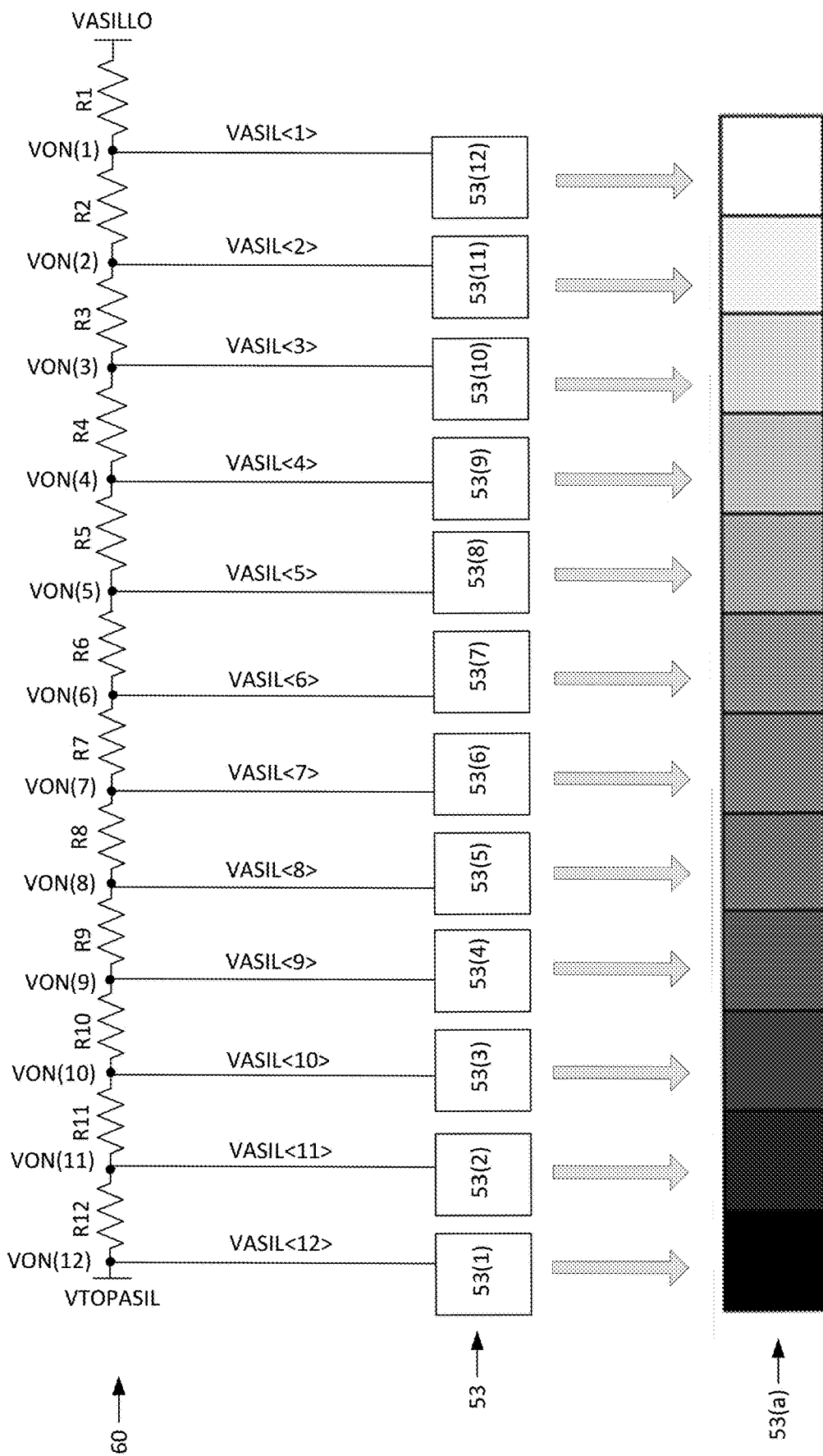
FIG. 10 is a diagram showing the uppermost ASIL pixel row of the active pixel array of FIG. 1, in which the connections between the reference voltages and the individual ASIL pixels of the uppermost ASIL pixel row can be seen, correlated to the associated luminances simulated by those individual ASIL pixels.

ASIL pixel row 53 of FIG. 2 is shown in greater detail in FIG. 10. As can be seen, the pixels 53(1)-53(12) of the ASIL pixel row 53 respectively receive the voltages VASIL<12>-VASIL<1> from nodes VON(12)-VON(1) of the voltage divider 60. Since VASILLO is the low reference voltage of the voltage divider 60, VASIL<1> is the lowest voltage produced as a reference and therefore provides a dummy input of white, as shown in reference 53(a). Likewise, since VTOPASIL is the high reference voltage of the voltage divider 60, VASIL<12> is the highest voltage produced as a reference for the ASIL pixel row 53, and therefore provides a dummy input of black, as shown in reference 53(a). Thus, the dummy inputs form the gradient pattern shown in reference 53(a).

Figure 11:
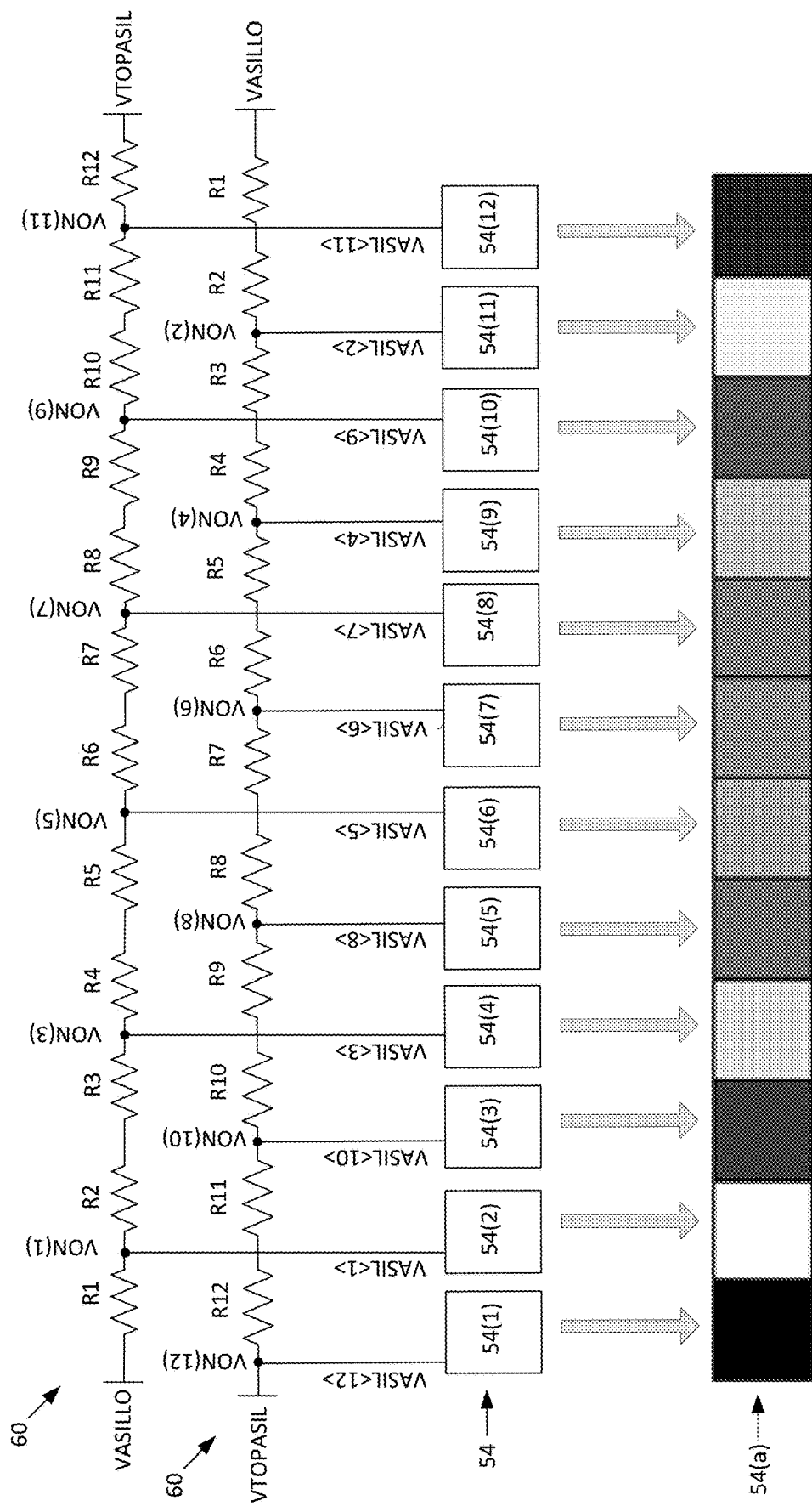
FIG. 11 is a diagram showing the ASIL pixel row of the active pixel array of FIG. 1 that is most adjacent to the array of image pixels 15, in which the connections between the reference voltages and the individual ASIL pixels of the ASIL pixel row of the active pixel array of FIG. 1 can be seen, correlated to the associated luminances simulated by those individual ASIL pixels.

ASIL pixel row 54 of FIG. 2 is shown in greater detail in FIG. 11. Here, it can be seen that even numbers of the ASIL pixels 54, which are 54(2), 54(4), 54(6), 54(8), 54(10) and 54(12) respectively receive the voltages VASIL<1>, VASIL<3>, VASIL<5>, VASIL<7>, VASIL<9>, and VASIL<11> from nodes VON[1], VON[3], VON[5], VON [7], VON[9], and VON[11], while odd numbers of the ASIL pixels 54, which are 54(1), 54(3), 54(5), 54(7), 54(9), and 54(11) receive the voltages VASIL<12>, VASIL<10>, VASIL<8>, VASIL<6>, VASIL<4>, VASIL<2> from nodes VON[12], VON[10], VON[8], VON[6], VON[4], and VON [2]. This results in the dummy inputs forming a cross-gradient pattern, as shown in reference 54(a).

In the ASIL pixel row 54 shown in FIG. 11, two instances of voltage divider 60 are shown, one producing the voltages VASIL<12>, VASIL<10>, VASIL<8>, VASIL<6>, VASIL<4>, and VASIL<2> from nodes VON[12], VON [10], VON[8], VON[6], VON[4], and VON[2], and the other producing the voltages VASIL<1>, VASIL<3>, VASIL<5>, VASIL<7>, VASIL<9>, and VASIL<11> from nodes VON [1], VON[3], VON[5], VON[7], VON[9], and VON[11]. The difference between these two shown multiple voltage dividers 60 is the reversal of the reference voltages VTOPA-SIL and VASILLO. While multiple voltage dividers 60 can be used, as shown, in some instances, but a single voltage divider 60 can be used, and can produce the voltages VASIL<1>-VASIL<12> from nodes VON[1]-VON[12].

Figure 12:
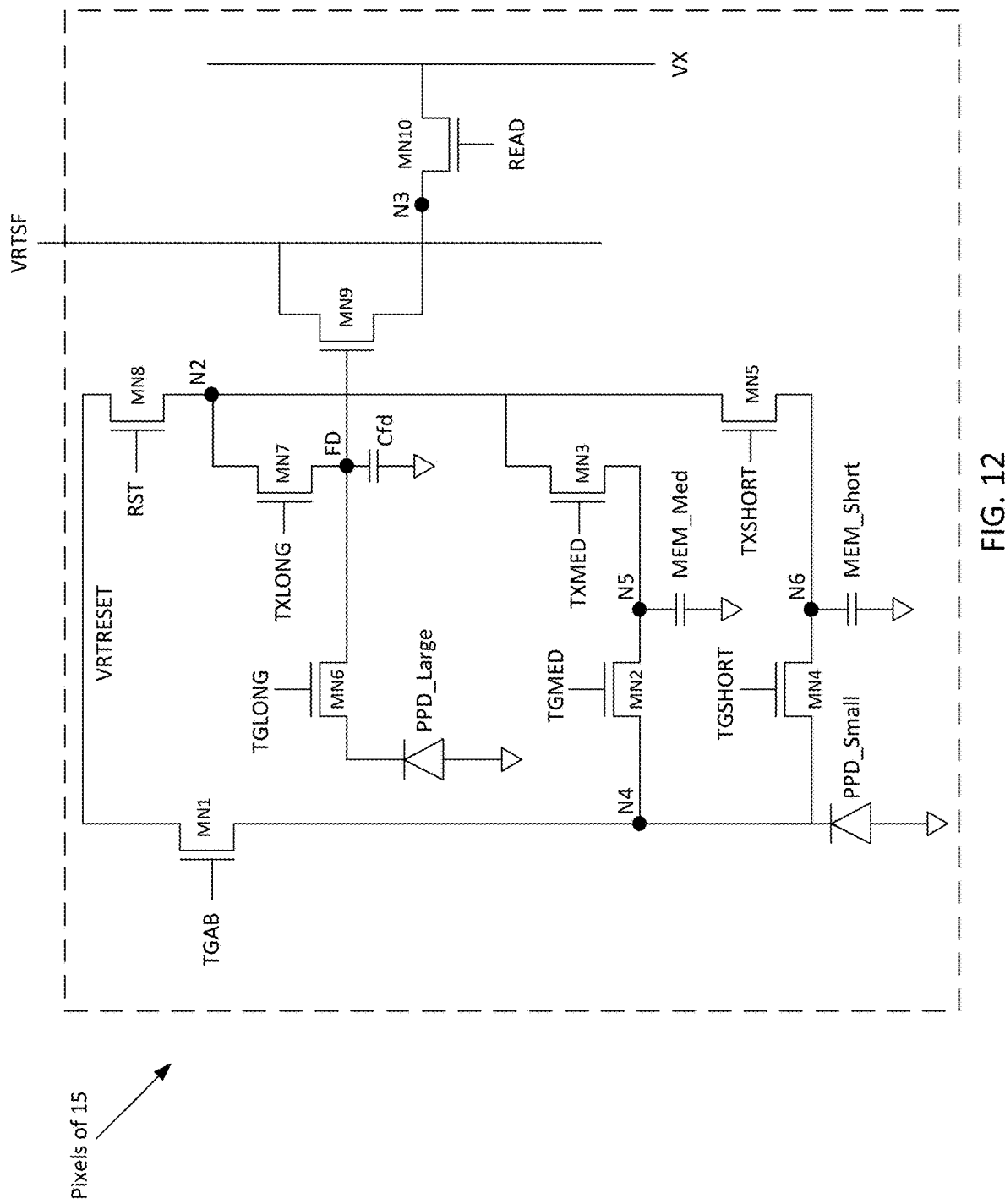
FIG. 12 is a schematic diagram showing the structure of one of the pixels of the array of pixels of FIG. 2.

As stated above with reference to FIG. 2, each pixel of the array of image pixels 15 has a same structure, which is depicted schematically in FIG. 3A. The pixels of the array of image pixels 15 of FIG. 2 are now described with reference to FIG. 12. The image pixels 15 include a photodiode PPD_Small and a photodiode PPD_Large, with the photodiode PPD_Large generating a greater amount of charge in response to a same number of impinging photons than the photodiode PPD_Small.

An NMOS transistor MN1 has its source coupled to the cathode of photodiode PPD_Small (through node N4), which has its anode coupled to ground. The drain of NMOS transistor MN1 is coupled to the VRTRESET line and its gate is biased by signal TGAB.

The photodiode PPD_Large has its anode coupled to ground and its cathode coupled to the source of NMOS transistor MN6. The drain of transistor MN6 is coupled to floating diffusion node FD, and the gate of transistor MN6 is based by the signal TGLONG. A floating diffusion capacitor Cfd is coupled between the floating diffusion node FD and ground. An NMOS transistor MN7 has its source coupled to the floating diffusion node FD, its drain coupled to node N2, and its gate biased by signal TXLONG. The NMOS transistor MN8 has its drain coupled to the VRTRESET line, its source coupled to node N2, and its gate biased by the reset signal RST.

The NMOS transistor MN9 is a source follower and has its drain coupled to the VRTSF line, its source coupled to node N3, and its gate biased by the floating diffusion node FD. The NMOS transistor MN10 has its drain coupled to node N3, its source coupled to the output line VX, and its gate biased by the read signal READ.

An NMOS transistor MN2 has its source coupled to node N4, its drain coupled to node N5, and its gate biased by signal TGMED. Memory capacitor MEM_Med is coupled between node N5 and ground. NMOS transistor MN3 has its source coupled to node N5, its drain coupled to node N2, and its gate biased by the TXMED signal.

The NMOS transistor MN4 has its source coupled to the cathode of the photodiode PPD_Small through node N4, its drain coupled to node N6, and its gate biased by the signal TGSHORT. NMOS transistor MN5 has its source coupled to node N6, its drain coupled to node N2, and its gate biased by the signal TXSHORT.

Operation will now be further described with reference to the timing diagrams of FIGS. 4-6. In a reset phase, shown in FIG. 4, the read signal READ, TGMED signal, and TGSHORT signals are deasserted, while the TGAB and TXLONG signals are asserted. In the reset phase, the reset signal RST is asserted during time period R1, initially charging the floating diffusion capacitor Cfd and the cathode of the small photodiode PPD_Small to VRTRESET. During time period R2, which occurs during the time period R1, the TGLONG signal is pulsed, causing charging of the cathode of the large photodiode PPD_Large to VRTRESET. Then, the reset signal RST is deasserted at the end of time period R1, and during time period R3, the TGLONG signal is again pulsed, resulting in current flowing from the floating diffusion capacitor Cfd to ground through the large photodiode PPD_Large, as a function of the number of photons impinging upon the large photodiode PPD_Large. During time period R4, the reset signal RST is asserted again, charging the floating diffusion capacitor Cfd again to VRTRESET. During time period R5, which occurs during time period R4, the TXSHORT signal is asserted which results in the memory capacitor MEM_Short being charged to VRTRESET. At time R6, which occurs during time R4, the TXMED signal is asserted, resulting in the memory capacitor MEM_Med to VRTRESET. The net effect of the reset phase is to charge the memory capacitors MEM_Med and MEM_Short to VRTRESET, and to charge the floating diffusion capacitor Cfd to VRTRESET less the charge lost to ground through the large photodiode PPD_Large during time period R3.

Referring now to FIG. 5, in a first phase, the memory capacitors MEM_Med and Mem_Short are discharged to charge values that are a function of the number of photons impinging upon the small photodiode PPD_small in a series of charge transfers. In greater detail, during a first charge transfer period CHRG1, the TGAB signal is asserted during time period T1, turning on NMOS transistor MN1, and thus resetting the cathode voltage of the small photodiode PPD_small to VRTRESET. Thereafter the TGMED signal is asserted during time period T2, turning on NMOS transistor MN2, resulting in current flowing from the memory capacitor MEM_Med to ground through the small photodiode PPD_Small, as a function of the number of photons impinging upon the small photodiode PPD_Small.

During a second charge transfer period CHRG2, the TGAB signal is asserted during time period T3, turning on NMOS transistor MN1 to again reset the cathode voltage of the small photodiode PPD_Small to VRTRESET. Thereafter, the TGSHORT signal is asserted during time period T4, turning on NMOS transistor MN4, resulting in current flowing from the memory capacitor MEM_Short to ground through the small photodiode PPD_Small, as a function of the number of photons impinging upon the small photodiode PPD_Small.

During a third charge transfer period CHRG3, the TGAB signal is asserted during time period T5, to again reset the cathode voltage of the small photodiode PPD_Small to VRTRESET. Thereafter, the TGMED signal is asserted during time period T6, turning on NMOS transistor MN2, resulting in current flowing from the memory capacitor MEM_Med to ground through the small photodiode PPD_Small, as a function of the number of photons impinging upon the small photodiode PPD_Small.

During a fourth charge transfer period CHRG4, the TGAB signal is asserted during time period T7, turning on NMOS transistor MN1 to again reset the cathode voltage of the small photodiode PPD_Small to VRTRESET. Thereafter, the TGSHORT signal is asserted during time period T8, turning on NMOS transistor MN4, resulting in current flowing from the memory capacitor Mem_Short to ground through the small photodiode PPD_Small, as a function of the number of photons impinging upon the small photodiode PPD_Small.

This repetition between time periods during which charge is shared between the small photodiode PPD_Small and memory capacitor MEM_Med, and during which charge is shared between the small photodiode PPD_Small and memory capacitor MEM_Short, is performed a sufficient number of times such that the luminance and/or chrominance data provided by the photodiode PPD_Small is ready for readout.

Now referring to FIG. 6, in a second phase, in order, the voltage on the floating diffusion capacitor Cfd is read out, the memory capacitor MEM_Med is read out, and then the memory capacitor MEM_Short is read out. In greater detail, during a first readout period READ1, the reset signal RST is asserted during time period TR1, serving to turn on NMOS transistors MN8 and MN7, resulting in the charging of the floating diffusion capacitor Cfd to VRTRESET. Then, the read signal READ is asserted during time period TR2, resulting in the NMOS transistor MN10 turning on, and the voltage on the floating diffusion capacitor Cfd, which is at or about VRTRESET, being replicated to the output VX via NMOS transistor MN9 acting as a source follower.

Now, the second readout period READ2 begins. During the time period TR3, the TGLONG signal is asserted, turning on NMOS transistor MN6, serving to discharge the floating diffusion capacitor Cfd through the large photodiode PPD_large as a function of the number of photons impinging upon the large photodiode PPD_large. Then, during the time period TR4, the read signal READ is asserted again, resulting in readout at the output VX of the voltage on the floating diffusion capacitor Cfd.

During the time period TR5, the reset signal RST is asserted, resulting in the floating diffusion capacitor Cfd being recharged to VRTRESET. Next, the third readout period READ3 begins. Then, during the time period TR6, the read signal READ is asserted, initially resulting in the readout at the output VX of the voltage on the floating diffusion capacitor Cfd, which is at or about VRTRESET. However, time period TR7 begins during time period TR6, and during time period TR6, the TXMED signal is asserted. This results in the NMOS transistor MN3 being turned on, the sharing of charge between the memory capacitor MEM_Med and the floating diffusion capacitor Cfd, and the readout at the output VX of the resulting voltage on the floating diffusion capacitor Cfd.

After this, the fourth readout period READ4 begins. During the time period TR8, the reset signal RST is asserted, turning on the NMOS transistor MN8 to charge the floating diffusion capacitor Cfd to VRTRESET. Of note is that during time period TR8, time period TR6 has not yet ended, so during time period TR8, VRTRESET as on the floating diffusion capacitor Cfd is read out at the output VX. Next, during time period TR9, the TXSHORT signal is asserted while time period TR6 continues. This results in sharing of charge between the memory capacitor MEM_Short and the floating diffusion capacitor Cfd, and the readout of the resulting voltage on the floating diffusion capacitor Cfd.

This ends a full cycle of operation of the image pixel 15. A new cycle begins anew with the reset phase.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   an array of image pixels having inputs coupled to control lines and outputs coupled to output lines; and
   an array of dummy pixels having inputs coupled to the control lines and outputs coupled to the output lines;
   wherein each dummy pixel of the array of dummy pixels is configured to provide a certain output signal in an absence of a fault with at least one of the control lines or in an absence of a fault with at least one of the output lines; and
   control circuitry coupled to the output lines to receive output signals from the array of image pixels and coupled to receive the certain output signals from the array of dummy pixels, the control circuitry configured to determine whether the certain output signal was output by one or more dummy pixels of the array of dummy pixels or whether a fault has occurred.

2. The electronic device of claim 1, wherein each pixel of the array of image pixels includes at least one photodiode and is configured to generate an output voltage as a function of light impinging upon the at least one photodiode; wherein each pixel of the array of dummy pixels includes an input receiving a different reference voltage that results in that pixel providing the certain output signal in an absence of the fault; and further comprising a voltage divider producing the different reference voltages that are received as input by each pixel of the array of dummy pixels.

3. The electronic device of claim 1, wherein each pixel of the array of image pixels includes at least one photodiode and is configured to generate an output voltage as a function of light impinging upon the at least one photodiode; wherein each pixel of the array of dummy pixels includes an input receiving a different reference voltage that results in that pixel providing the certain output signal in an absence of the fault; and further comprising a voltage divider coupled between upper and lower reference voltages, with each different reference voltage being produced at a different tap of the voltage divider.

4. The electronic device of claim 1, further comprising control circuitry coupled to the output lines to receive output signals from the array of image pixels and the certain output signals from array of dummy pixels, the control circuitry configured to determine whether the certain output signal was output by one or more dummy pixels of the array of dummy pixels.

5. The electronic device of claim 4, wherein the control circuitry is configured to generate an error flag based upon the determination that the certain output signal was not output by one or more of the dummy pixels of the array of dummy pixels.

6. An electronic device, comprising:
   an array of image pixels having inputs coupled to control lines and outputs coupled to output lines; and
   at least one array of dummy pixels having inputs coupled to the control lines;
   wherein each dummy pixel of the at least one array of dummy pixels is configured to provide a certain output signal in an absence of a fault with at least one of the control lines or in an absence of a fault with at least one of the output lines; and
   wherein the at least one array of dummy pixels comprises first and second column arrays of dummy pixels arranged about first and second opposing sides of a periphery of the array of image pixels.

7. The electronic device of claim 6, wherein the at least one array of dummy pixels further comprises first and second row arrays of dummy pixels positioned adjacent a third side of the periphery of the array of image pixels.

8. The electronic device of claim 7, wherein the first column array of dummy pixels is coupled to some of the control lines and the second column array of dummy pixels is coupled to others of the control lines.

9. The electronic device of claim 8, wherein the first row array of dummy pixels is coupled to some of the output lines and the second row array of the dummy pixels is coupled to others of the output lines.

10. The electronic device of claim 8, wherein each pixel of the array of image pixels includes at least one photodiode, each pixel of the array of image pixels being configured to generate an output voltage at its output as a function of light impinging upon the at least one photodiode; and each pixel of the at least one array of dummy pixels includes an input receiving a different reference voltage in response to which the pixel of the at least one array of dummy pixels provides the certain output signal in an absence of a fault with at least one of the control lines or in absence of a fault with at least one of the output lines; wherein the first column array of dummy pixels, from top to bottom, receives the different reference voltages in descending order such that a highest reference voltage is received by a top dummy pixel of the first column array of dummy pixels and such that a lowest reference voltage is received by a bottom dummy pixel of the first column array of dummy pixels.

11. The electronic device of claim 10, wherein every odd pixel of the second column array of dummy pixels, from top to bottom, receives the different reference voltages in descending order such that a highest reference voltage is received by a top odd dummy pixel of the first column array of dummy pixels and such that a lowest reference voltage is received by a bottom odd dummy pixel of the first column array of dummy pixels; and wherein every even pixel of the second column array of dummy pixels, from bottom to top, receives the difference reference voltages in ascending order such that the highest reference voltage is received by a bottom even dummy pixel of the second column array of dummy pixels and such that the lowest reference voltage is received by a top even dummy pixel of the second column array of dummy pixels.

12. An electronic device, comprising:
a voltage divider coupled between upper and lower reference voltages and having a plurality of taps therebetween, each tap producing a different reference voltage; and
a plurality of dummy pixels, each dummy pixel comprising:
a transfer gate transistor having a first conduction terminal coupled to a floating diffusion node, a second conduction terminal, and a control node coupled to a first gate signal line;
a transmission gate coupled between one of the plurality of taps and the second conduction terminal of the transfer gate transistor;
a floating diffusion capacitor coupled between the floating diffusion node and ground;
a transistor having a first conduction terminal coupled to the floating diffusion node, a second conduction terminal, and a control terminal coupled to a second gate signal line;
a reset transistor having a first conduction terminal coupled to the upper reference voltage, a second conduction terminal coupled to the second conduction terminal of the transistor, and a control terminal coupled to a reset signal line; and
readout circuitry coupled between the floating diffusion node and a read signal line.

13. The electronic device of claim 12, wherein the voltage divider comprises:
a first voltage regulator generating the upper reference voltage at a first regulator output;
a second voltage regulator generating the lower reference voltage at a second regulator output; and
a plurality of resistors coupled in series between the first regulator output and the second regulator output, with different ones of the plurality of taps being located between adjacent ones of the plurality of resistors.

14. The electronic device of claim 13, wherein the first voltage regulator comprises a first buffer, and wherein the second voltage regulator comprises a second buffer; and wherein the voltage divider further comprises:
a first current generator generating a second current as a function of a first current selection signal;
a first current mirror mirroring the second current to a first subtraction node;
a second current generator generating a fourth current as a function of a second current selection signal, and providing the fourth current to the first subtraction node;
a second current mirror receiving a first current from the first subtraction node and mirroring the first current to a second subtraction node, the first current representing a difference between the fourth current and the second current; and
wherein an input of the first buffer is coupled to the second subtraction node.

15. The electronic device of claim 14, wherein the voltage divider further comprises: an adjustable resistance coupled to the second subtraction node; and a mirror transistor in a current mirror relationship with the first current mirror and drawing the second current through the adjustable resistance; wherein an input of the second buffer is coupled to a tap of the adjustable resistance.

16. The electronic device of claim 12, wherein each dummy pixel further comprises:
a second transistor having a first conduction terminal coupled to said one of the plurality of taps, a second conduction terminal, and a control signal coupled to a third gate line signal;
a third transistor having a first conduction terminal coupled to the second conduction terminal of the second transistor, a second conduction terminal coupled to a first memory node, and a control signal coupled to a fourth gate line signal;
a fourth transistor having a first conduction terminal coupled to the first memory node, a second conduction terminal coupled to the second conduction terminal of the reset transistor, and a control terminal coupled to a fifth gate line signal;
a first memory capacitor coupled between the first memory node and ground;
a fifth transistor having a first conduction terminal coupled to the second conduction terminal of the second transistor, a second conduction terminal coupled to a second memory node, and a control terminal coupled to a sixth gate line signal;
a sixth transistor having a first conduction terminal coupled to the second conduction terminal of the reset transistor, a second conduction terminal coupled to the second memory node, and a control terminal coupled to a seventh gate line signal;
a second memory capacitor coupled between the second memory node and ground; and
a storage capacitor coupled between the second conduction terminal of the second transistor and ground.

17. A method of detecting a fault with an array of image pixels, the method comprising:
comparing an output of each dummy pixel of an array of dummy pixels to a corresponding certain output signal;
wherein a failure of a dummy pixel to produce output equal to its corresponding certain output signal indicates a potential fault with the array of image pixels.

18. The method of claim 17, further comprising receiving a different reference voltage at each pixel of the array of dummy pixels that ultimately results in that each pixel providing the certain output signal in an absence of a potential fault.

19. The method of claim 18, further comprising using a voltage divider coupled between first and second reference voltages to produce the different reference voltages that are received by each pixel of the array of dummy pixels.

* * * * *